United States Patent
Zhang et al.

(10) Patent No.: US 9,202,803 B2
(45) Date of Patent: Dec. 1, 2015

(54) LASER CAVITY FORMATION FOR EMBEDDED DIES OR COMPONENTS IN SUBSTRATE BUILD-UP LAYERS

(71) Applicants: Chong Zhang, Chandler, AZ (US); Stefanie M. Lotz, Phoenix, AZ (US); Qinglei Zhang, Chandler, AZ (US); Sri Ranga Boyapati, Chandler, AZ (US); Nikhil Sharma, Chandler, AZ (US); Islam A. Salama, Chandler, AZ (US)

(72) Inventors: Chong Zhang, Chandler, AZ (US); Stefanie M. Lotz, Phoenix, AZ (US); Qinglei Zhang, Chandler, AZ (US); Sri Ranga Boyapati, Chandler, AZ (US); Nikhil Sharma, Chandler, AZ (US); Islam A. Salama, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/229,734

(22) Filed: Mar. 28, 2014

(65) Prior Publication Data
US 2015/0279817 A1   Oct. 1, 2015

(51) Int. Cl.
*H01L 23/24* (2006.01)
*H01L 25/065* (2006.01)

(52) U.S. Cl.
CPC ... *H01L 25/0657* (2013.01); *H01L 2225/06572* (2013.01)

(58) Field of Classification Search
CPC .............. H01L 23/315; H01L 23/3121; H01L 23/3192; H01L 23/5389; H01L 24/82
USPC .................... 438/108; 257/723, 724, 773, 774
See application file for complete search history.

(56) References Cited

U.S. PATENT DOCUMENTS

| 7,285,862 | B2 * | 10/2007 | Sunohara et al. ............. 257/774 |
| 7,754,538 | B2 * | 7/2010 | Hsu ............................... 438/125 |
| 2002/0004257 | A1 * | 1/2002 | Takaoka et al. ............... 438/107 |
| 2005/0230835 | A1 * | 10/2005 | Sunohara et al. ............. 257/758 |

* cited by examiner

*Primary Examiner* — Kevin M Picardat
(74) *Attorney, Agent, or Firm* — Blakely, Sokoloff, Taylor & Zafman LLP

(57) ABSTRACT

An apparatus including a package substrate including a plurality of layers of conductive material, the package substrate including a cavity; and a device in the cavity, wherein an ultimate layer of the plurality of layers of conductive material defines contacts to contact points of the device. An apparatus including a package substrate comprising a plurality of conductive layers and a silicon bridge die disposed between ones of the plurality of conductive layers and an ultimate layer of the plurality of conductive layers defines contact points to contact points of the silicon bridge die; and a logic die coupled to the contact points of the ultimate layer of the plurality of layers of conductive layers.

14 Claims, 6 Drawing Sheets

LASER CAVITY FORMATION FOR EMBEDDED DIES OR COMPONENTS IN SUBSTRATE BUILD-UP LAYERS

FIELD

Embedded component in substrate build-up layer.

BACKGROUND

To overcome bandwidth limitations between logic-logic and/or logic-memory communication in multi-chip packages (MCPs), embedded silicon bridges (SiB) have been proposed to achieve ultra high density die-to-die interconnections.

DETAILED DESCRIPTION

Figure 1:
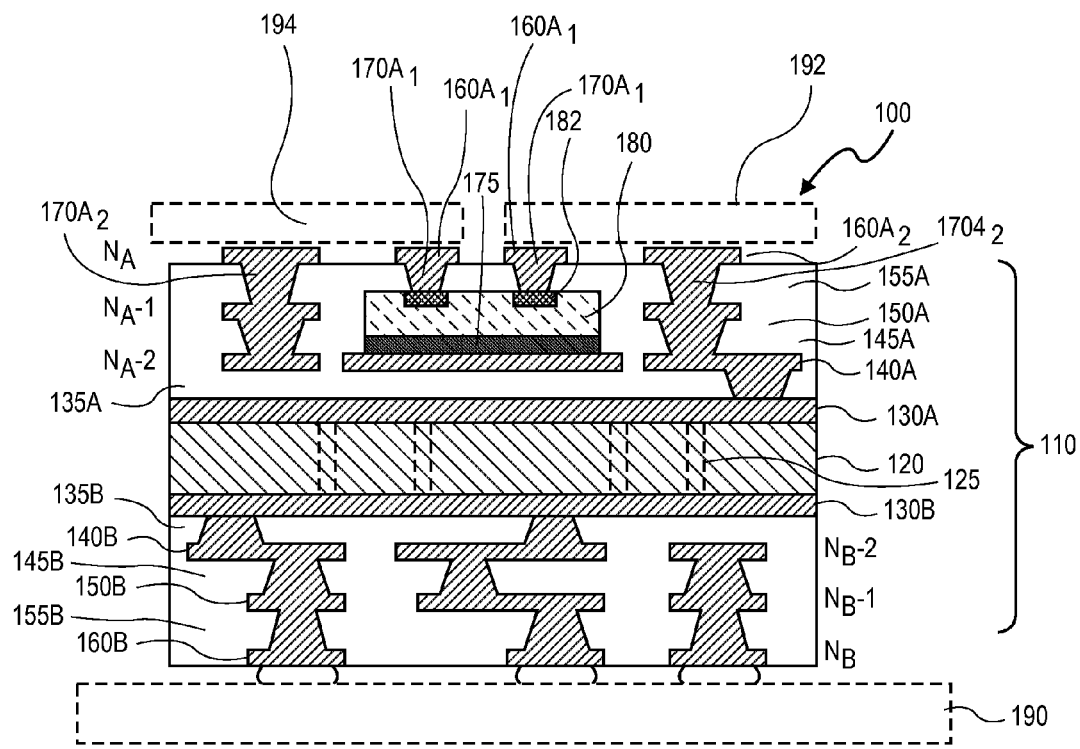
FIG. 1 shows a cross-sectional side view of a microelectronic package according to one embodiment.

FIG. 1 shows a cross-sectional side view of a microelectronic package assembly according to one embodiment. Microelectronic package 100 utilizes build-up layer technology involving the build-up of alternating conductive lines or layers and dielectric layers on opposing sides of a core substrate. Package assembly 100, in this embodiment, includes package substrate 110 including core substrate 120 including conductive layer 130A connected to a first side of core substrate and conductive layer 130B connected to a second side of core substrate. Conductive layer 130A and conductive layer 130B are each, for example, a copper material. A first side of core substrate 120 includes multiple layers or levels of patterned conductive material such as copper that are separated from adjacent layers by dielectric material layers. FIG. 1 shows conductive material layer or level 140A, conductive material layer or level 150A and conductive material layer or level 160A. Disposed between conductive material layer or level 140A and conductive layer or level 150A is dielectric layer 145A of, for example, an organic dielectric material such as ABF introduced as a film or sheet. Disposed between conductive layer or level 150A and adjacent conductive layer or level 160A is dielectric material layer 155A, in one embodiment, also an organic dielectric material such as an ABF film. In one embodiment, conductive layer or level 160A defines an ultimate layer or level of package substrate 110. The ultimate level includes contact pads for connection of dice or packages to substrate package 110. The conductive layer or level is illustrated as contact pads $160A_1$ and contact pads $160A_2$. It is appreciated that a package substrate may have a number of conductive layers. The illustration in FIG. 1 shows three conductive layers on a first side of die 110. Conductive layer or level 160A ($160A_1$ and $160A_2$) is the ultimate layer or level and identified by the nomenclature of $N_A$. Conductive layer or level 150A is the penultimate layer or level and identified as $N_A-1$. Conductive layer or level 140A is the antepenultimate layer or level and identified as $N_A-2$.

Disposed between conductive material layers or levels $N_A-1$ and $N_A-2$ is silicon bridge (SiB) die 180. A backside of silicon bridge die 180 is connected to conductive layer or level 140A through adhesive 175 such as a die backside film. In one embodiment, SiB die 180 is not electrically connected to conductive layer or level 140A at the connection. A device side of SiB die 180 includes contacts 182 that are connected through conductive vias $170A_1$ to an ultimate level or layer conductive material (conductive layer or level $160A_1$ ($N_A$)). FIG. 1 representatively shows memory die 192 and logic die 194 each in dashed lines connected to contact pads $160A_1$ defined by conductive layer or level 160A and to contacts 182 of SiB die 180 (e.g., connected by solder connections). Other contact pads $160A_2$ connected to vias $170A_2$ are available for connection to other devices or packages.

In the embodiment shown in FIG. 1, contact pads $160A_1$ are illustrated and described as being connected to contacts of logic die 194 and/or memory die 192 through, for example, solder connections. In another embodiment, after forming the ultimate conductive level or layer N1 (160A) as contact pads illustrated as $160A_1$ and $160A_2$, a solder resist may be formed on the structure including on the contact pads, as a blanket. Openings are then made through the solder resist to the contact pads ($160A_1$ and $160A_2$) and the exposed contact pads then receive a surface finish (e.g., a nickel based finish, nickel-palladium-gold). The surface finished contact pads may then be directly bonded to a die or package or a solder material may be introduced on the surface finish pads prior to bonding.

As illustrated in FIG. 1, SiB die 180 is embedded in package substrate 110, specifically between conductive layer or level 140A ($N_A-2$) and conductive layer or level 150A ($N_A-1$) and encapsulated by dielectric material (dielectric material 155A between conductive layer or level 150A and conductive layer or level 160A and dielectric material 145A between conductive layer or level 140A and conductive layer or level 150A). Encapsulating or fully embedding SiB die 180 within multiple build-up layers (at least two build-up layers as illustrated in FIG. 1) allows thicker dies of, for example, 30 microns (µm) to 50 µm minimum thickness, to be accommodated in a fully embedded package substrate. In addition to enabling thicker silicon bridge dies to be fully embedded, the formation helps with control of a dielectric film thickness variation over and surrounding the bridge die(s) which promotes complete via formation onto bridge pads 182, as well as to reduce assembly issues such as no-contact openings or solder bridging when bonding logic die 194 and/or memory die 192 to package 100.

Disposed on an opposite second side of core substrate 120 is an additional number of conductive layers or levels. FIG. 1 shows conductive layer or level 140B, conductive layer or level 150B and conductive layer or level 160B disposed on a second side of core substrate 120 with each conductive layer or level separated by dielectric material. As illustrated, disposed between conductive layer or level 140B and conductive layer or level 150B is dielectric material 145B of, for example, an organic dielectric material such as ABF film or sheet. Disposed between conductive layer or level 150B and conductive layer or level 160B is dielectric material 155B also, in one embodiment, an organic dielectric such as an ABF film. Conductive layer or level 160B defines the ultimate level or layer on the second side of core substrate 120 and is patterned into contact pads suitable for connection, in one embodiment, to a printed circuit board by, for example, solder connections. FIG. 1 shows printed circuit board 190 illustrated in dashed lines. Conductive layer or level 160B is identified by the nomenclature of $N_B$ with the penultimate layer (conductive layer or level 150B) identified as $N_B-1$ and the antepenultimate level (conductive layer or level 140B) identified as $N_B-2$. In one embodiment, contact pads associated with conductive layer 160B are connected (e.g., through conductive vias to conductive layer 150B and/or 140B) to interconnections on the first side of core substrate 120 through conductive vias 125 through the substrate and ultimately to silicon bridge die 180 and/or logic die 194 and/or memory die 192 through one or more connections to conductive material layer 140A, conductive material layer 150A and/or conductive material layer 160A.

FIGS. 2-11 describe one embodiment for forming a microelectronic package such as microelectronic package 100 (FIG. 1) including an SiB die embedded therein. The method will describe the incorporation of a single SiB die. The method may also be used to incorporate a number of SiB dies and/or other devices in a package.

Figure 2:
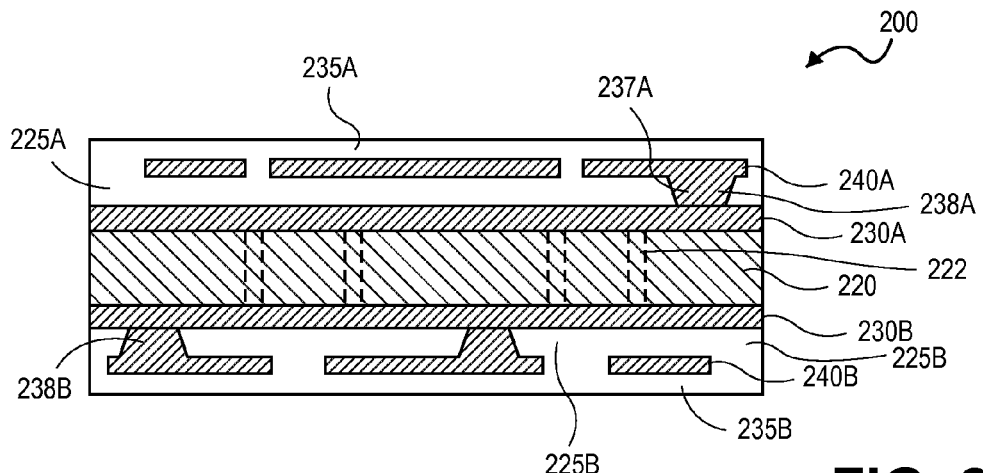
FIG. 2 shows a core substrate that is, for example, a glass reinforced composite material with a first conductive material layer (or multiple layers) or level patterned on each side of the core substrate.

According to FIG. 2, FIG. 2 shows core substrate 220 that is, for example, a glass reinforced composite material. Disposed on a first side of core substrate 220 is conductive material layer 230A. In one embodiment, conductive material layer 230A is a patterned copper layer. Disposed on a second opposite side of core substrate 220 is conductive material layer 230B also, in one embodiment, of a patterned copper material. Core substrate 220, in one embodiment, has a number of plated through vias connecting a first side to a second side (e.g., connected between conductive material layer 230A and conductive material layer 230B). Disposed on conductive material layer 230A is dielectric layer 225A and disposed on conductive material layer 230B is dielectric layer 225B. In one embodiment, each of dielectric layer 225A and dielectric layer 225B is an organic dielectric material such as ABF. In one embodiment, the ABF may be introduced as a film or sheet in a lamination process.

Overlying dielectric layer 225A in the embodiment shown in FIG. 2 is antepenultimate first conductive material layer 240A. Overlying dielectric layer 225B is antepenultimate first conductive material layer 240B. Each of conductive material layer is connected to the underlying conductive material layer 230A/230B by conductive through vias 238A and 238B, respectively. In one embodiment, first conductive material layer 240A/240B and conductive through vias 238A/238B are electroplated copper. Representatively, vias may be opened through dielectric material 225A/225B by a laser drilling process. The vias and an exposed surface of dielectric layers 225A/225B may then be seeded with, for example, a copper seed material. The seeding may be followed by the introduction of a mask material, such as dry film resist (DFR) that is patterned as desired for first conductive material layer 240A/240B. Following introduction and patterning of the mask material, copper material may be introduced by a plating process to form the conductive through vias 238A/238B and first conductive material layer 240A/240B. Following the formation of the conductive layer, the patterned material and any excess seed material may be removed.

Structure 200 shown in FIG. 2 also includes dielectric layer 235A on first conductive layer 240A and dielectric layer 235B on first conductive material layer 240B. In one embodiment, dielectric layer 235A and dielectric layer 235B are each ABF material introduced as a film or sheet in a lamination process.

Figure 3:
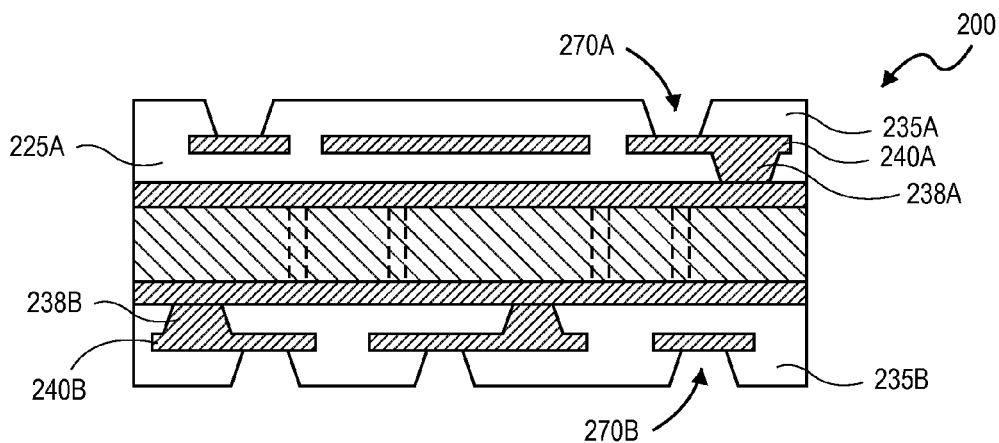
FIG. 3 shows the structure of FIG. 2 following the formation of vias to the first conductive material layer.

FIG. 3 shows the structure of FIG. 2 following the formation of vias to conductive material layer 240A and conductive material layer 240B. In one embodiment, vias are formed through dielectric layer 235A/235B by a laser drilling process. FIG. 3 shows vias 270A in dielectric layer 235A and vias 270B in dielectric layer 235B. Following the opening of vias to conductive material layer 240A/240B, a desmear process may be performed to clean the vias.

Figure 4:
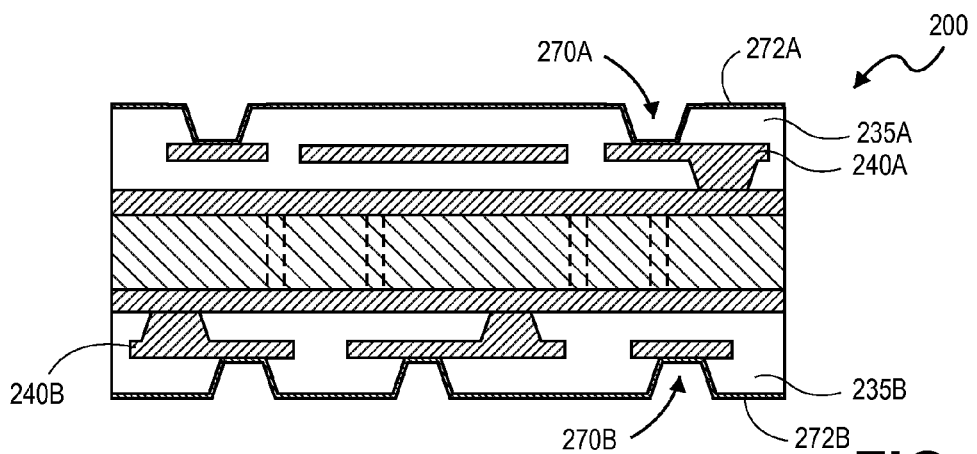
FIG. 4 shows the structure of FIG. 3 following the introduction of a seed material.

FIG. 4 shows the structure of FIG. 3 following the introduction of a seed material. In one embodiment, a seed material is an electroless deposited copper material. FIG. 4 shows seed material 270A introduced and formed on an exposed surface of dielectric layer 235A. The seed material is formed on the surface of dielectric layer 235A and in vias 270A. Similarly, FIG. 4 shows seed material 272B introduced and formed on an exposed surface of dielectric layer 235B and in vias 270B.

Figure 5:
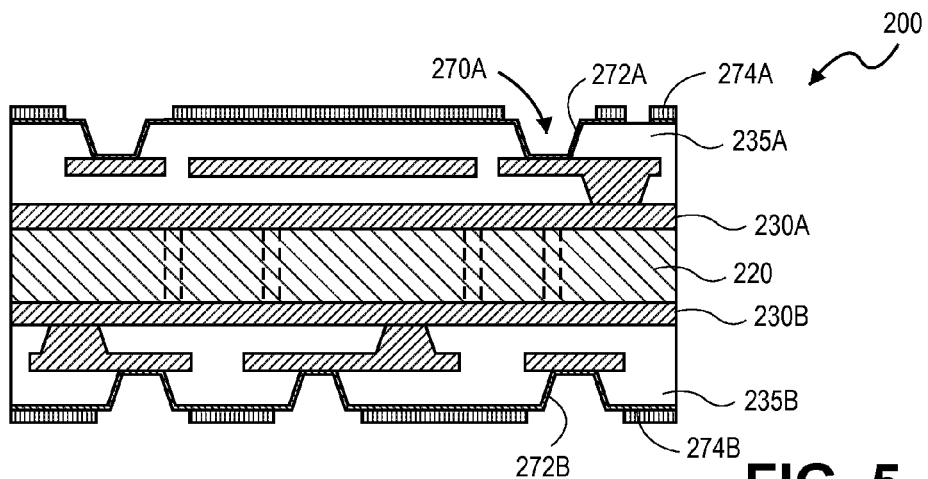
FIG. 5 shows the structure of FIG. 4 following the introduction and patterning of a mask material on the structure.

FIG. 5 shows the structure of FIG. 4 following the introduction and patterning of a mask material on the structure. In one embodiment, a suitable mask material is dry film resist (DFR) that may be introduced as a film in a lamination process. Once introduced, the DFR may be patterned by exposing areas of the material to a light source and developing. FIG. 5 shows mask material 274A of, for example, DFR patterned on seed material 272A with openings to vias 270A and patterned for a conductive material layer. Similarly, FIG. 5 shows mask material 274B on seed layer 272B with openings to vias 270B and for a conductive material layer.

Figure 6:
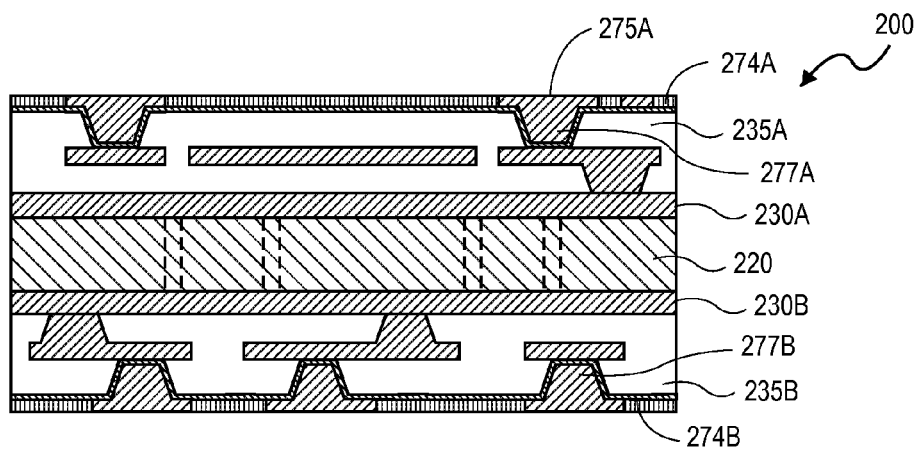
FIG. 6 shows the structure of FIG. 5 following the formation of a conductive material layer on opposite sides of the core substrate.

FIG. 6 shows the structure of FIG. 5 following the formation of a penultimate conductive material layer. In one embodiment, a conductive material layer is copper that is introduced by an electroplating process. FIG. 6 shows penultimate conductive material layer 275A formed on seed layer 272A and conductive vias 277A formed between conductive material layer 240A and conductive material layer 275A. Similarly, FIG. 6 shows penultimate conductive material layer 275B formed on seed material 272B and conductive vias 277B between conductive material layer 240B and conductive material layer 275B.

Figure 7:
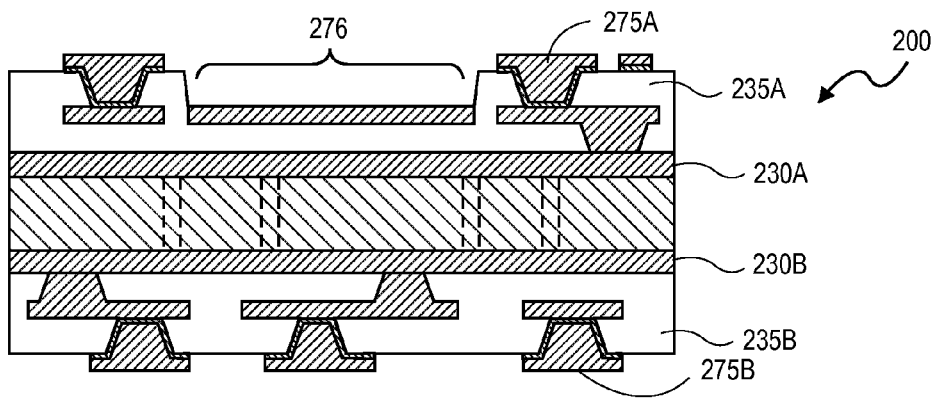
FIG. 7 shows the structure of FIG. 6 following the removal of the masking material and excess seed material and the formation of a cavity on a first side of the structure.

FIG. 7 shows the structure of FIG. 6 following the removal of mask material 274A and mask material 274B from the respective sides of structure 200 and also the removal of excess seed material 272A and 272B. Removal of both masking material and see material may proceed according to processes known in the art (e.g., etch techniques).

FIG. 7 also shows the structure of FIG. 6 following the opening of a cavity for a device such as a SiB die. FIG. 7 shows cavity 276 formed in dielectric material 235A on a first side of core substrate 220. In one embodiment, cavity 276 is formed by a laser ablation process through an area having dimensions (width, length) to accommodate an SiB die.

Figure 8:
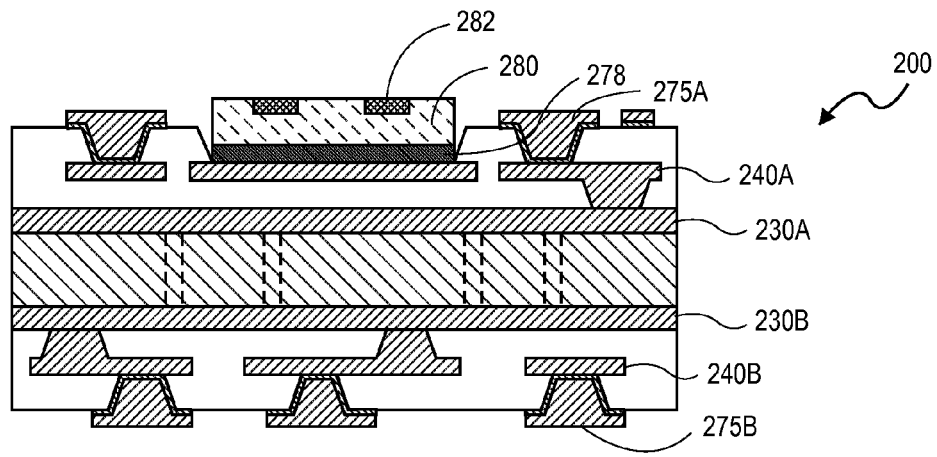
FIG. 8 shows the structure of FIG. 7 following the introduction or placement of a SiB die in the cavity formed on a first side of the structure.

FIG. 8 shows the structure of FIG. 7 following the introduction or placement of an SiB die in the cavity formed on a first side of the structure. FIG. 8 shows SiB die 280 in cavity 276. Die includes contacts 282 on one side and an opposite backside (non-contacts side). In one embodiment, a backside (non-contacts side) of SiB die 280 is fixed/bonded to the structure by adhesive 278 such as a die backside film (DBF). As illustrated die backside film is disposed between a backside of SiB die 280 and, in this illustration, conductive material layer 240A. In one embodiment, there is no direct electrical connection between the backside of SiB die 280 and conductive material layer 240A. A copper roughening process may be applied to roughen a surface of conductive material layer 275A and contacts 282 of SiB die 280.

Figure 9:
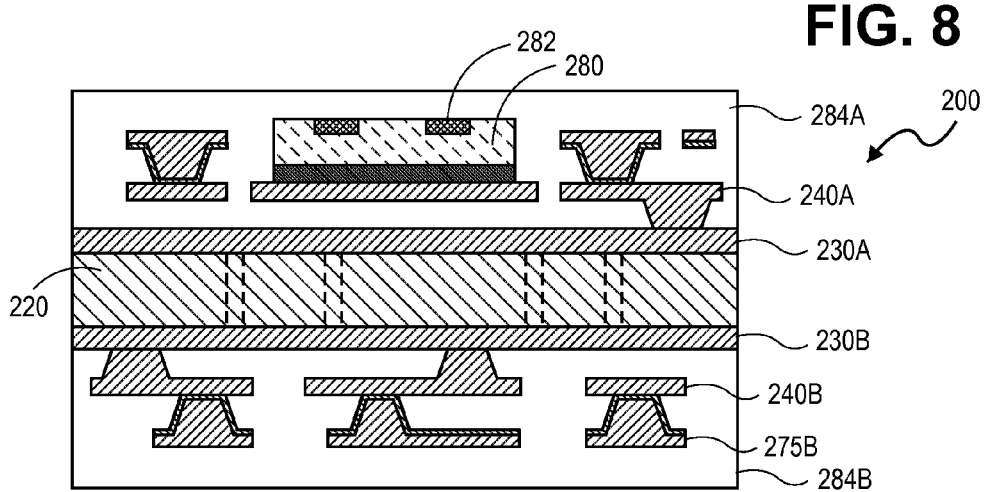
FIG. 9 shows the structure of FIG. 8 following the introduction of dielectric material layer on the structure.

FIG. 9 shows the structure of FIG. 8 following the introduction of dielectric material layer on the structure. FIG. 9 shows dielectric layer 284A of, for example, an ABF film laminated on a first side of structure 200 and dielectric layer 284B also of an ABF film laminated on a second side of the structure. In this embodiment, dielectric layer 284A encapsulates SiB die 280 within the structure.

Figure 10:
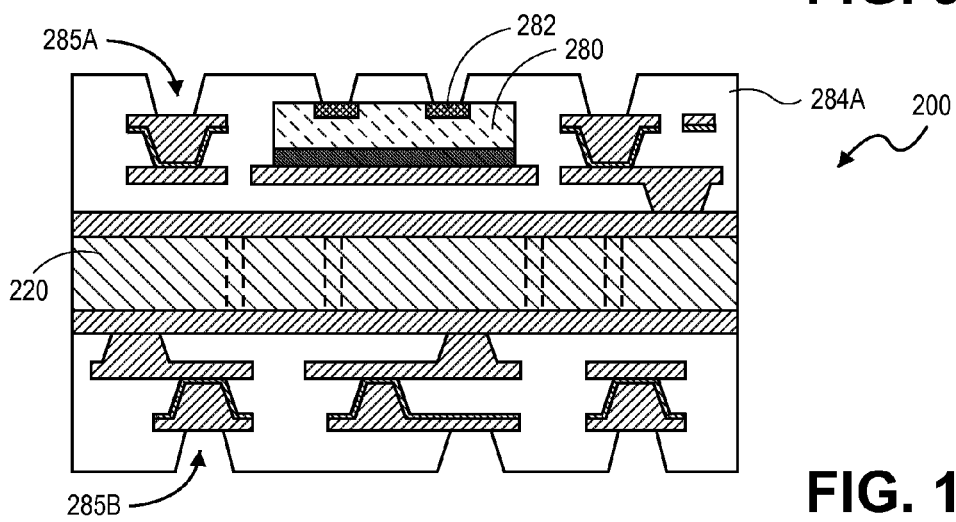
FIG. 10 shows the structure of FIG. 9 following the opening of the vias to conductive material layer and to the contacts of the SiB die.

FIG. 10 shows the structure of FIG. 9 following the opening of vias 285A to conductive material layer 275A and to contacts of SiB die 280. Similarly, vias 285B are open to conductive material layer 275B. One process for opening vias in a dielectric material such as ABF is through a $CO_2$ and/or ultraviolet (UV) laser process. Following the opening of vias, a desmear may be performed to clean the openings.

Figure 11:
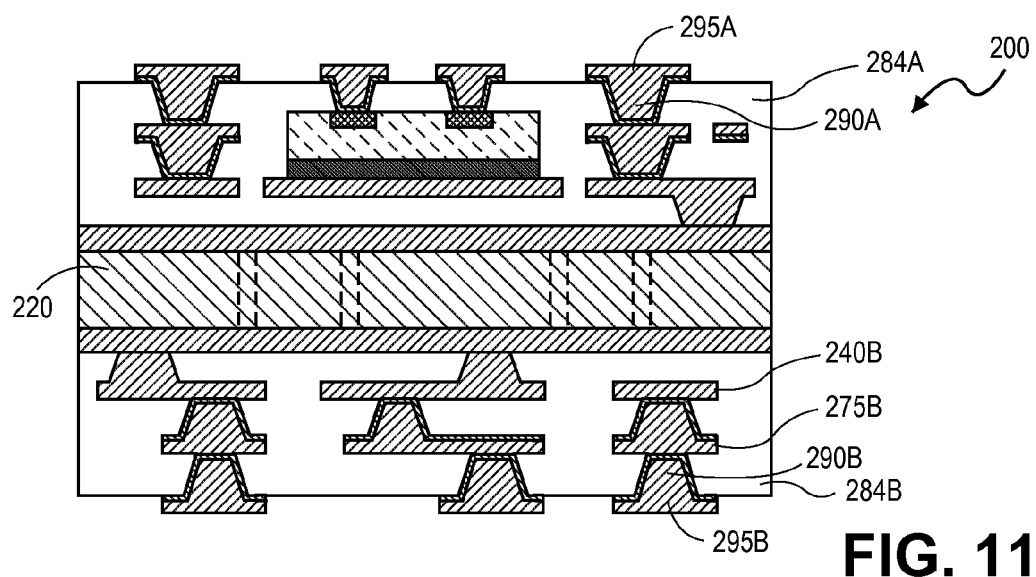
FIG. 11 shows the structure of FIG. 10 following the formation of a conductive material layer and conductive vias to a penultimate conductive material layer.

FIG. 11 shows the structure of FIG. 10 following the formation of an ultimate conductive material layer and conductive vias to penultimate conductive material layer 275A/275B. FIG. 11 shows ultimate conductive material layer 295 formed on dielectric layer 284A and ultimate conductive material layer 295B formed on dielectric layer 284B. Each of conductive material layer 295A and conductive material layer 295B are in the form of contact pads on a surface of dielectric layer 284A and dielectric layer 284B, respectively. Such contact pads and respective vias 290A to penultimate conductive material layer 275A and conductive vias 290B to penultimate conductive material layer 275B may be formed by an electroplating process. For certain applications, solder resist material may be included on the contact pads defined in conductive material layer 295A and conductive material layer 295B. If solder resist material is included, solder resist openings (SROs) would then be formed to expose the interconnect. Surface finish and/or solder material could then be included inside the SRO.

FIG. 11 illustrates an embodiment of a package substrate (package substrate 200) having an embedded and encapsulated SiB die. SiB die 280 is formed in cavity 276 formed between a penultimate conductive material layer (conductive material layer 275A, N-1) and an antepenultimate conductive material layer 240A, N-2). A backside of SiB die 280 is bonded to the antepenultimate conductive material layer. FIG. 11 shows the die encapsulated in the structure. Depending upon the thickness of a particular die, the die may be encapsulated as illustrated or partially reset inside a cavity. Careful selection of dielectric thickness and process optimization of lamination conditions enable targeted final desired dielectric thickness. The creation of a cavity in a package substrate allows for accommodating thicker die (e.g., SiB die on the order of 50 μm) to embed within a substrate build-up that spans more than a single build-up dielectric layer thickness. By partially recessing a die inside a cavity, the process in effect reduces the die protrusion and resultant final profile of the dielectric layer.

In the above embodiment, a process of embedding a silicon-bridge die in a package substrate was described. It is appreciated that such method or apparatus is not limited to embedding silicon bridge die but can apply to embedding other devices such as capacitors, inductors, sensors or other device with a thickness thin enough to be embedded in a build-up layer. Thus, in another embodiment, a microelectronic package assembly includes a package substrate incorporating one or more of such other devices embedded therein or a silicon bridge device with one or more such other devices embedded therein.

Figure 12:
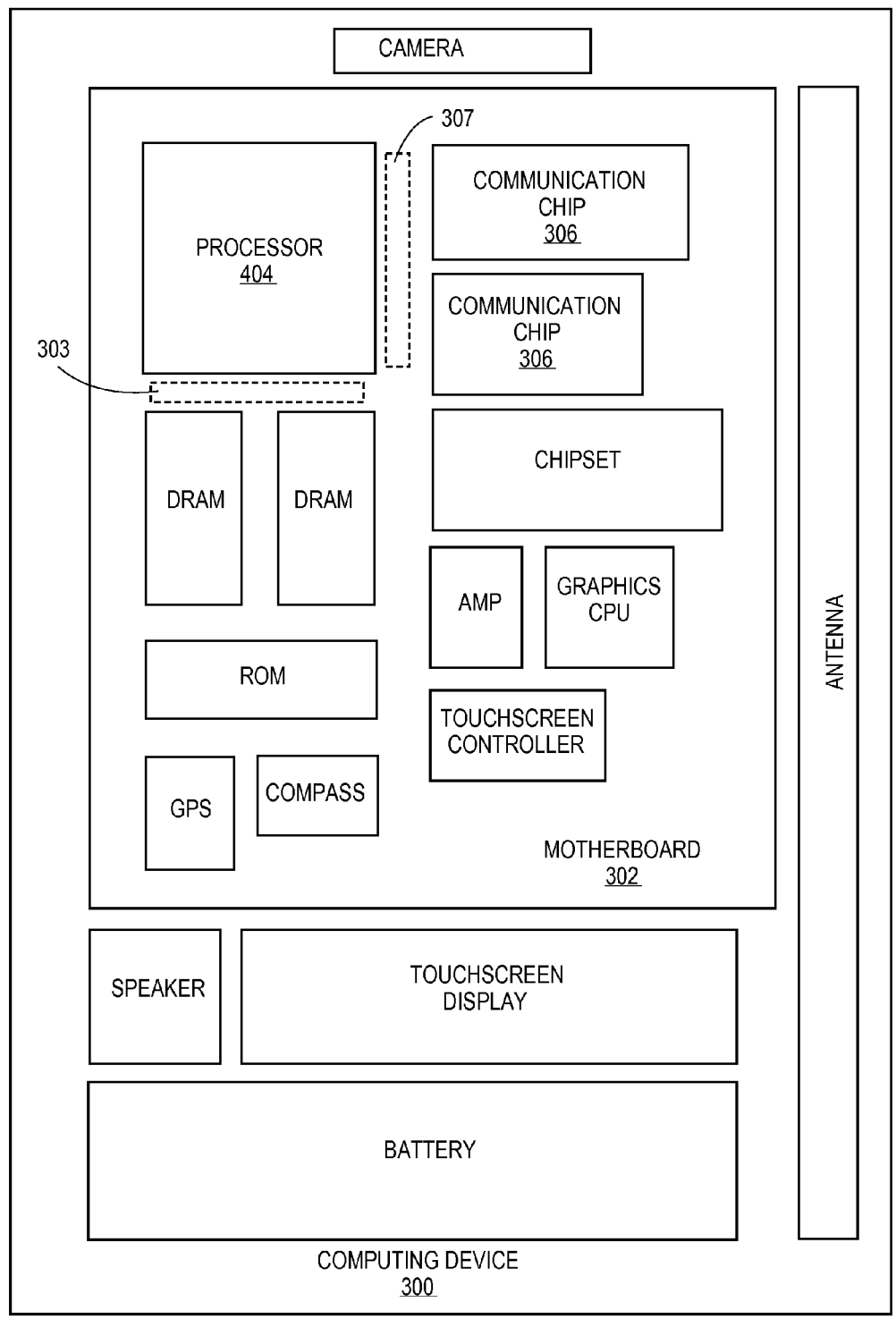
FIG. 12 illustrates an embodiment of a computing device.

FIG. 12 illustrates computing device 300 in accordance with one implementation. Computing device 300 houses board 302. Board 302 may include a number of components, including but not limited to processor 304 and at least one communication chip 306. Processor 304 is physically and electrically coupled to board 302. In some implementations the at least one communication chip 306 is also physically and electrically coupled to board 302. In further implementations, communication chip 306 is part of processor 304.

Depending on its applications, computing device 300 may include other components that may or may not be physically and electrically coupled to board 302. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

Communication chip 306 enables wireless communications for the transfer of data to and from computing device 300. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chip 306 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 300 may include a plurality of communication chips 306. For instance, a first communication chip 306 may be dedicated to shorter range wireless communications such as Wi-Fi and Bluetooth and a second communication chip 306 may be dedicated to longer range wireless communications such as GPS, EDGE, GPRS, CDMA, WiMAX, LTE, Ev-DO, and others.

Processor 304 of computing device 300 includes an integrated circuit die packaged within processor 304. In some implementations, the package formed in accordance with embodiment described above utilizes build-up technology with a package substrate including an embedded SiB die (e.g., SiB die 303) or other devices. The term "processor" may refer to any device or portion of a device that processes electronic data from registers and/or memory to transform that electronic data into other electronic data that may be stored in registers and/or memory.

Communication chip 306 also includes an integrated circuit die packaged within communication chip 306. In accordance with another implementation, package is based on build-up technology and incorporates a package substrate including an SiB die (e.g., SiB die 307).

In further implementations, another component housed within computing device 300 may contain a microelectronic package that incorporates a primary build-up carrier implementation such as described above.

In various implementations, computing device 300 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, computing device 300 may be any other electronic device that processes data.

In the description above, for the purposes of explanation, numerous specific details have been set forth in order to provide a thorough understanding of the embodiments. It will be apparent however, to one skilled in the art, that one or more other embodiments may be practiced without some of these specific details. The particular embodiments described are not provided to limit the invention but to illustrate it. The scope of the invention is not to be determined by the specific examples provided above but only by the claims below. In other instances, well-known structures, devices, and operations have been shown in block diagram form or without detail in order to avoid obscuring the understanding of the description. Where considered appropriate, reference numerals or terminal portions of reference numerals have been repeated among the figures to indicate corresponding or analogous elements, which may optionally have similar characteristics.

EXAMPLES

Example 1 is an apparatus including a package substrate including a plurality of layers of conductive material, the package substrate including a cavity; and a device in the cavity, wherein an ultimate layer of the plurality of layers of conductive material defines contacts to contact points of the device.

In Example 2, the apparatus of Example 1 further includes a dielectric material between the ultimate layer of the plurality of layers of conductive material and the device.

In Example 3, the device in the apparatus of Example 1 includes a silicon bridge die.

In Example 4, the package substrate in the apparatus of Example 1 further includes a plurality of dielectric layers respective ones of which are disposed between the plurality of layers of conductive material.

In Example 5, the package substrate in the apparatus of Example 4 further includes a core substrate and the plurality of conductive layers are disposed on the core substrate.

In Example 6, the plurality of layers of conductive material in the apparatus of Example 1 includes a penultimate layer and the silicon bridge die is disposed between the penultimate layer.

In Example 7, the plurality of layers of conductive material in the apparatus of Example 1 includes a penultimate layer and the silicon bridge die is disposed on the penultimate layer.

In Example 8, the silicon bridge die in the apparatus of Example 7 includes a contact side and a backside and the backside of the die is coupled to the penultimate layer.

In Example 9, the ultimate layer of the plurality of layers of conductive material in the apparatus of Example 1 defines contact points, the apparatus further including a first die connected to a first one of the contact points and a second die is connect to a second one of the contact points.

In Example 10, the first die in the apparatus of Example 9 includes a logic die and the second die comprises a memory die.

In Example 11, the ultimate layer of the plurality of layers of conductive material in the apparatus of Example 1 defines contact points, the apparatus further including a surface finish on the contact points.

In Example 12, the plurality of conductive layers in the apparatus of Example 3 are disposed on a first side of the core substrate, the apparatus further including contact points on a second side of the core substrate, wherein the contact points are coupled to interconnections on the first side of the core substrate.

Example 13 is an apparatus including a package substrate including a plurality of conductive layers and a device disposed between ones of the plurality of conductive layers.

In Example 14, the ultimate layer of the plurality of layers of conductive material in the apparatus of Example 13 defines contacts to contact points of the device.

In Example 15, the ultimate layer of the plurality of conductive layers in the apparatus of Example 13 defines contact points.

In Example 16, the package substrate in the apparatus of Example 15 includes a core substrate and the plurality of conductive layers are disposed on a first side of the core substrate and the package substrate further includes a plurality of contact points on a second side of core substrate.

Example 17 is an apparatus including a package substrate including a plurality of conductive layers and a silicon bridge die disposed between ones of the plurality of conductive layers and an ultimate layer of the plurality of conductive layers defines contact points to contact points of the silicon bridge die; and a logic die coupled to the contact points of the ultimate layer of the plurality of layers of conductive layers.

In Example 18, the logic die in the apparatus of Example 17 is coupled to ones of the contact points of the ultimate layer of the plurality of conductive layers, the apparatus further including a memory die coupled to other contact points of the ultimate layer of the plurality of conductive layers.

In Example 19, the silicon bridge die in the apparatus of Example 17 is disposed between the ultimate layer of the plurality of conductive layers and a penultimate layer of the plurality of conductive layers.

In Example 20, the package substrate in the apparatus of Example 17 includes a core substrate and the plurality of conductive layers are disposed on a first side of the core substrate and the package substrate further includes a plurality of contact points on a second side of core substrate.

It should also be appreciated that reference throughout this specification to "one embodiment", "an embodiment", "one or more embodiments", or "different embodiments", for example, means that a particular feature may be included in the practice of the invention. Similarly, it should be appreciated that in the description various features are sometimes grouped together in a single embodiment, figure, or description thereof for the purpose of streamlining the disclosure and aiding in the understanding of various inventive aspects. This method of disclosure, however, is not to be interpreted as reflecting an intention that the invention requires more features than are expressly recited in each claim. Rather, as the following claims reflect, inventive aspects may lie in less than all features of a single disclosed embodiment. Thus, the claims following the Detailed Description are hereby expressly incorporated into this Detailed Description, with each claim standing on its own as a separate embodiment of the invention.

What is claimed is:

1. An apparatus comprising:
 a package substrate comprising a plurality of layers of conductive material; and
 a silicon bridge die comprising a contact side and a back side, wherein the back side of the silicon bridge die is coupled to the package at an antepenultimate layer of the plurality of layers of conductive material and wherein the silicon bridge die is disposed between a penultimate layer and an ultimate layer of the plurality of layers of conductive material and wherein the contact side oriented in a direction of the ultimate layer of the plurality of layers of conductive material,
 wherein an ultimate layer of the plurality of layers of conductive material defines contacts to contact points on the device side of the silicon bridge die.

2. The apparatus of claim 1, further comprising a dielectric material between the ultimate layer of the plurality of layers of conductive material and the device.

3. The apparatus of claim 1, wherein the package substrate further comprises a plurality of dielectric layers respective ones of which are disposed between the plurality of layers of conductive material.

4. The apparatus of claim 1, wherein the ultimate layer of the plurality of layers of conductive material define contact points, the apparatus further comprising a first die connected to a first one of the contact points and a second die connected to a second one of the contact points.

5. The apparatus of claim 4, wherein the first die comprises a logic die and the second die comprises a memory die.

6. The apparatus of claim 1, wherein the ultimate layer of the plurality of layers of conductive material defines contact points, the apparatus further comprising a surface finish on the contact points.

7. The apparatus of claim 1, wherein the plurality of conductive layers are disposed on a first side of the core substrate, the apparatus further comprising contact points on a second side of the core substrate, wherein the contact points are coupled to interconnections on the first side of the core substrate.

8. An apparatus comprising:
 a package substrate comprising a plurality of conductive layers and a die comprising a contact side and a back side, wherein the back side of the die is coupled at an antepenultimate layer of the plurality of conductive layers and disposed between a penultimate and an ultimate layer of the plurality of conductive layers.

9. The apparatus of claim 8, wherein an ultimate layer of the plurality of conductive layers defines contacts to contact points of the device.

10. The apparatus of claim 8, wherein the ultimate layer of the plurality of conductive layers defines contact points.

11. The apparatus of claim 10, wherein the package substrate comprises a core substrate and the plurality of conductive layers are disposed on a first side of the core substrate and the package substrate further comprises a plurality of contact points on a second side of core substrate.

12. An apparatus comprising
 a package substrate comprising a plurality of conductive layers and a silicon bridge die coupled at a antepenultimate layer of the plurality of conductive layers and disposed between the penultimate layer and an ultimate layer of the plurality of conductive layers defines contact points to contact points of the device side of the silicon bridge die; and
 a logic die coupled to the contact points of the ultimate layer of the plurality of layers of conductive layers.

13. The apparatus of claim 12, wherein the logic die is coupled to ones of the contact points of the ultimate layer of the plurality of conductive layers, the apparatus further comprising a memory die coupled to other contact points of the ultimate layer of the plurality of conductive layers.

14. The apparatus of claim 12, wherein the package substrate comprises a core substrate and the plurality of conductive layers are disposed on a first side of the core substrate and the package substrate further comprises a plurality of contact points on a second side of core substrate.

\* \* \* \* \*